(12) United States Patent
Hagan et al.

(10) Patent No.: US 8,491,806 B2
(45) Date of Patent: Jul. 23, 2013

(54) CHEMICAL-MECHANICAL POLISHING FORMULATION AND METHODS OF USE

(75) Inventors: James A. Hagan, Hopewell Junction, NY (US); James Hannah, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 57 days.

(21) Appl. No.: 12/685,938

(22) Filed: Jan. 12, 2010

(65) Prior Publication Data
US 2011/0171832 A1    Jul. 14, 2011

(51) Int. Cl.
*H01L 21/302* (2006.01)

(52) U.S. Cl.
USPC .............. 216/88; 216/89; 216/100; 216/108; 438/692; 438/693

(58) Field of Classification Search
None
See application file for complete search history.

(56) References Cited

U.S. PATENT DOCUMENTS

| | | | |
|---|---|---|---|
| 6,436,834 B1 * | 8/2002 | Lee et al. | 438/693 |
| 6,641,630 B1 * | 11/2003 | Sun | 51/307 |
| 6,849,099 B2 | 2/2005 | Ohno et al. | |
| 2003/0079416 A1 * | 5/2003 | Ma et al. | 51/307 |
| 2003/0087525 A1 * | 5/2003 | Sinha et al. | 438/691 |
| 2010/0216309 A1 * | 8/2010 | Minami et al. | 438/693 |

* cited by examiner

*Primary Examiner* — Anita Alanko
(74) *Attorney, Agent, or Firm* — Scully, Scott, Murphy & Presser, P.C.; Katherine S. Brown, Esq.

(57) ABSTRACT

The invention is directed to a chemical-mechanical polishing formulation that includes: an abrasive particulate component; iodic acid; and water. The invention is also directed to a method for polishing a metal-containing substrate, the method including the steps of polishing the metal-containing substrate with a polishing pad at a suitable polishing pressure while the metal-containing substrate is in contact with the above polishing formulation.

11 Claims, 2 Drawing Sheets

US 8,491,806 B2

CHEMICAL-MECHANICAL POLISHING FORMULATION AND METHODS OF USE

BACKGROUND

The present invention generally relates to chemical-mechanical polishing (CMP) formulations, and more particularly, to CMP formulations for polishing or planarizing metal surfaces, such as tungsten.

Chemical-mechanical polishing or planarization (CMP) is a commonly used technique for the polishing and/or planarization of various substrates. CMP is particularly used in semiconductor fabrication for the polishing and planarization of metal-containing wafers. A metal commonly included in semiconductor wafers and for which CMP processing is required is tungsten (W).

CMP formulations generally include both an abrasive component (e.g., silica particles) and a corrosive component (e.g., periodic acid) in order to effectively polish a substrate surface using both mechanical and chemical processes. However, particularly for the case of metal substrates, and, in particular, tungsten, there has been an ongoing effort to find CMP formulations which can provide a higher etch rate while producing a uniformly polished surface according to the precise standards of the semiconductor industry. A higher etch rate corresponds to shorter process times, and thus, higher throughputs. Therefore, a significantly increased etch rate can result in significant cost savings for the process. There would be a further benefit if such improved CMP formulations are readily integratable into existing CMP processes and are of the same approximate cost as formulations commonly used in the art.

SUMMARY

The invention generally involves using, as a CMP processing solution in a CMP process, a liquid CMP formulation that contains iodic acid. The CMP formulation is particularly suitable and advantageous for the polishing of metal-containing substrates, and, in particular, tungsten-containing substrates. In a particular embodiment, the CMP formulation includes an abrasive particulate component; iodic acid; and water. In another embodiment, the CMP formulation further includes an amount of periodic acid.

The iodic acid-containing CMP formulation described herein advantageously provides a higher etch rate of metal-containing surfaces than CMP formulations of the art that rely solely on periodic acid. The higher etch rate shortens the etch processing times, thereby resulting in greater processing efficiency and significant cost savings. In addition, the CMP formulations described herein are readily integratable into existing CMP processes. Further, the CMP formulations described herein have a cost generally well within the cost of CMP formulations of the art. Moreover, the CMP formulations described herein are capable of producing a polished surface that is highly uniform (i.e., level) in thickness and morphology.

DETAILED DESCRIPTION OF PARTICULAR EMBODIMENTS

Figure 1:
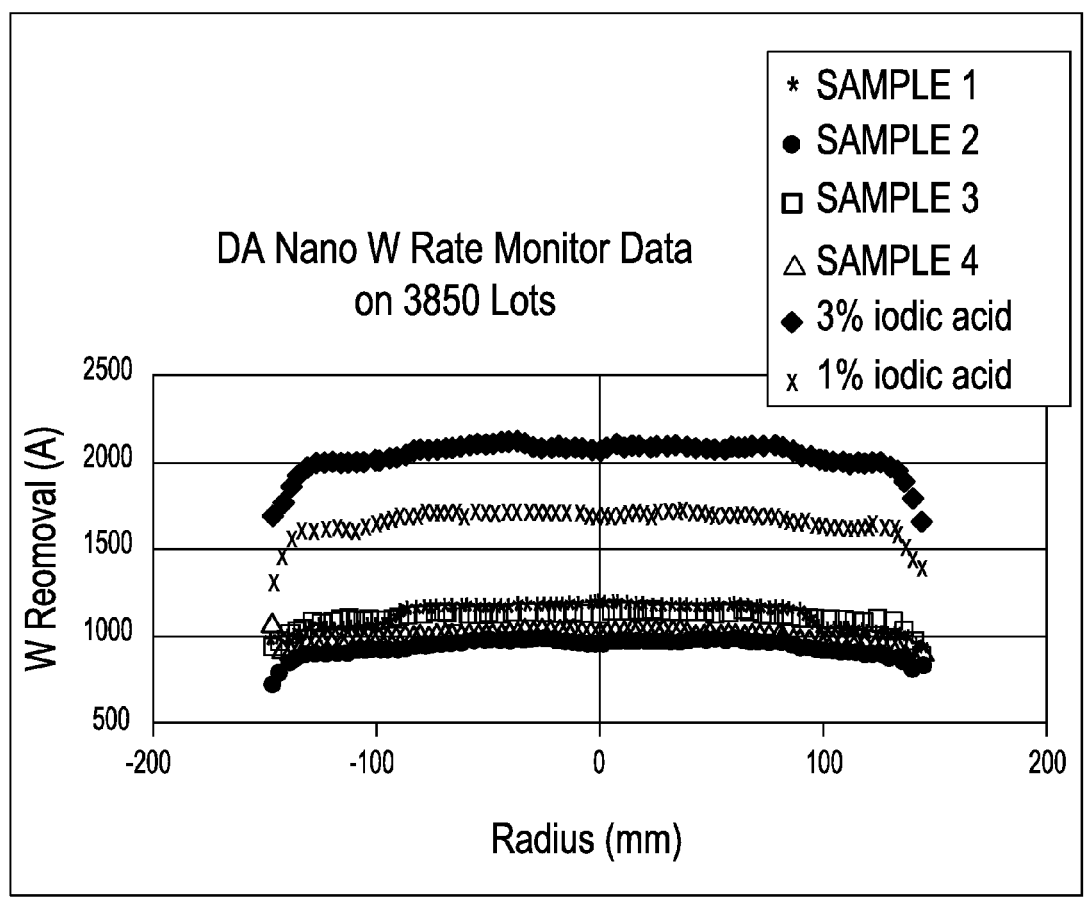
FIG. 1 is a graph showing tungsten removal in Å vs. position across a 300 mm tungsten wafer.

In one aspect, the invention is directed to a chemical-mechanical polishing (CMP) formulation. In one embodiment, the CMP formulation (i.e., "the formulation" or "slurry") includes an abrasive particulate component; iodic acid; and water, in the absence of periodic acid. In another embodiment, the foregoing CMP formulation further includes periodic acid.

The abrasive particulate component (i.e., abrasive) can be any of the abrasive particulate materials known in the art useful for CMP processing of metal-containing substrates. Preferably, the abrasive particulate component has a silica composition (e.g., colloidal or fumed silica). However, several other abrasive types of particles are applicable herein, including, for example, alumina, diamond, ceria, yttria, zirconia, titania, or a combination thereof (e.g., titania-zirconia, yttria-stabilized zirconia, alumina-zirconia, and the like). Furthermore, the abrasive can be a surface-modified form of any of the foregoing exemplary abrasives, wherein the surface modification performs such functions as improving the polishing performance and/or maintaining the integrity or dispersion stability of the abrasive in the CMP formulation.

Typically, the abrasive considered herein has an average particle size of at least 30 nm. In different exemplary embodiments, the average particle size of the abrasive is about, or at least, or no more than 30 nm, 40 nm, 50 nm, 60 nm, 70 nm, 80 nm, 90 nm, 100 nm, 120 nm, 140 nm, 160 nm, 180 nm, 200 nm, 220 nm, 240 nm, 260 nm, 280 nm, or 300 nm. Alternatively, the average particle size can within a range bounded by any two of the foregoing exemplary values (e.g., 30-300 nm or 50-150 nm). The abrasive is in the CMP formulation in an amount that makes the CMP suitable in a CMP process. Typically, the abrasive is in an amount of at least 10 grams (10 g) per liter (1 L) of the formulation. In different embodiments, the abrasive can preferably be in an amount of about, at least, or no more than, for example, 20 g/L, 30 g/L, 40 g/L, 50 g/L, 60 g/L, 70 g/L, 80 g/L, 90 g/L, 100 g/L, 110 g/L, 120 g/L, 130 g/L, 140 g/L, 150 g/L, 160 g/L, 170 g/L, 180 g/L, 190 g/L, or 200 g/L, or within a range bounded by any two of the foregoing exemplary values.

In one embodiment, the formulation contains iodic acid in the absence of periodic acid. As used herein, "iodic acid" refers to a compound of formula $HIO_3$, or an iodate salt (i.e., salt of $IO_3^-$), or a combination thereof. The cation of the iodate salt can be any suitable cation, such as, for example, an ammonium cation (e.g., $NR_4^+$, where R represents a H atom or alkyl group of, typically, 1-6 carbon atoms), alkali cation (e.g., $Li^+$, $Na^+$, $K^+$), alkaline earth cation (e.g., $Mg^{2+}$, $Ca^{2+}$, $Sr^{2+}$), or transition metal cation. Some particular examples of iodate salts include ammonium iodate, sodium iodate, calcium iodate, silver iodate, and potassium hydrogen iodate (i.e., $KH(IO_3)_2$). In different embodiments, the iodic acid is solely in a non-salt form (i.e., iodate salts are excluded), or the iodic acid is solely a particular iodate salt compound, or the iodic acid is a combination of iodate salts (i.e., non-salt forms of iodic acid are excluded), or the iodic acid is a combination of a non-salt form of iodic acid and one or more iodate salts. In a preferred embodiment, the iodate salt is not an alkali iodate or alkaline earth iodate since these salts have a tendency to leave a residue on a semiconductor substrate after the semiconductor substrate is treated in a CMP process with one of these salts.

In another embodiment, the formulation contains iodic acid in combination with periodic acid. The periodic acid can be any of the chemical forms of periodic acid known in the art. Typically, the periodic acid is orthoperiodic acid (i.e., of formula $H_5IO_6$), or metaperiodic acid (i.e., of formula $HIO_4$), or a combination thereof. The periodic acid can also be a periodate salt, such as a salt of $IO_4^-$, $H_4IO_6^-$, $H_3IO_6^{2-}$, $H_2IO_6^{3-}$, or $HIO_6^{4-}$. The periodic acid can also be a combination of a non-salt of periodic acid and a periodate salt. The cation of the periodate salt can be any suitable cation, and in particular, any of the cations specified above for salts of iodic acid. Some examples of suitable periodate salts include ammonium periodate, sodium periodate, potassium periodate, calcium periodate, silver periodate, and sodium hydrogen periodate. In different embodiments, the periodic acid is solely in a non-salt form (i.e., periodate salts are excluded), or the periodic acid is solely a particular periodate salt compound, or the periodic acid is a combination of periodate salts (i.e., non-salt forms of periodic acid are excluded), or the periodic acid is a combination of a non-salt form of periodic acid and one or more periodate salts.

Preferably, the formulation during use in a CMP process contains the iodic acid in an amount (i.e., concentration) of at least 0.1, 0.2, 0.3, 0.4, or 0.5 grams per liter (g/L) of the formulation. In particular embodiments, the iodic acid can preferably be in an amount of about, at least, or no more than, for example, 0.6 g/L, 0.8 g/L, 1 g/L, 1.2 g/L, 1.4 g/L, 1.5 g/L, 1.6 g/L, 1.8 g/L, 2 g/L, 2.2 g/L, 2.4 g/L, 2.6 g/L, 2.8 g/L, 3 g/L, 3.2 g/L, 3.4 g/L, 3.6 g/L, 3.8 g/L, 4 g/L, 4.2 g/L, 4.4 g/L, 4.6 g/L, 4.8 g/L, 5 g/L, 5.2 g/L, 5.4 g/L, 5.6 g/L, 5.8 g/L, 6 g/L, 6.2 g/L, 6.4 g/L, 6.6 g/L, 6.8 g/L, 7 g/L, 7.2 g/L, 7.4 g/L, 7.6 g/L, 7.8 g/L, 8 g/L, 8.2 g/L, 8.4 g/L, 8.6 g/L, 8.8 g/L, 9 g/L, 9.2 g/L, 9.4 g/L, 9.6 g/L, 9.8 g/L, 10 g/L, 10.5 g/L, 11 g/L, 11.5 g/L, 12 g/L, 12.5 g/L, 13 g/L, 13.5 g/L, 14 g/L, 14.5 g/L, 15 g/L, 15.5 g/L, 16 g/L, 16.5 g/L, 17 g/L, 17.5 g/L, 18 g/L, 18.5 g/L, 19 g/L, 19.5 g/L, or 20 g/L. Alternatively, the iodic acid can be present in an amount within a range bounded by any two of the foregoing exemplary values (for example, 0.5-20 g/L, 0.5-15 g/L, or 1-15 g/L). The foregoing exemplary concentrations of iodic acid are valid for formulations that contain iodic acid in the absence of periodic acid and formulations that contain iodic acid in combination with periodic acid.

When periodic acid is present, the periodic acid can also be in any of the exemplary concentrations or ranges specified above for iodic acid (i.e., independently of the amount of iodic acid). In particular embodiments, the periodic acid has a concentration within a range of, for example, 1-20 g/L, 2-20 g/L, 3-20 g/L, 4-20 g/L, 5-20 g/L, 6-20 g/L, 8-20 g/L, 10-20 g/L, 12-20 g/L, 1-16 g/L, 2-16 g/L, 3-16 g/L, 4-16 g/L, 5-16 g/L, 6-16 g/L, 8-16 g/L, 10-16 g/L, 12-16 g/L, 1-14 g/L, 2-14 g/L, 3-14 g/L, 4-14 g/L, 5-14 g/L, 6-14 g/L, 8-14 g/L, 10-14 g/L, 12-14 g/L, 1-12 g/L, 2-12 g/L, 3-12 g/L, 4-12 g/L, 5-12 g/L, 6-12 g/L, 8-12 g/L, or 10-12 g/L.

In a first embodiment, the molar or weight amount of iodic acid is greater than the molar or weight amount of periodic acid in the CMP formulation (for example, at least 10 g/L or 15 g/L of iodic acid and less than 10 g/L, or at or less than 5 g/L, or at or less than 2 g/L of periodic acid). In another embodiment, the molar or weight amount of iodic acid is substantially the same (e.g., within 10% or 5%) as the molar or weight amount of periodic acid (for example, about 10 g/L of iodic acid and about 10 g/L of periodic acid). In another embodiment, the molar or weight amount of iodic acid is less than the molar or weight amount of periodic acid (for example, less than 10 g/L, 5 g/L, or 1 g/L of iodic acid and at least 10 g/L or 15 g/L of periodic acid).

The weight or molar relationship between iodic and periodic acid can alternatively be expressed in terms of the weight percent (wt %) of iodic acid per total weight of iodic acid and periodic acid, or in terms of the weight percent of periodic acid per total weight of iodic acid and periodic acid. For example, in different embodiments, iodic acid or periodic acid can be present in the formulation in an amount of about, or at least, or no more than 1 wt %, 2 wt %, 3 wt %, 4 wt %, 5 wt %, 6 wt %, 7 wt %, 8 wt %, 9 wt %, 10 wt %, 12 wt %, 15 wt %, 20 wt %, 25 wt %, 30 wt %, 35 wt %, 40 wt %, 45 wt %, 50 wt %, 55 wt %, 60 wt %, 65 wt %, 70 wt %, 75 wt %, 80 wt %, 85 wt %, 90 wt %, or 95 wt % per total weight of iodic acid and periodic acid, or within a range bounded by any two of the foregoing exemplary values. In the foregoing examples, weight percent (wt %) can also be replaced with molar percent (mol %).

The weight or molar relationship between iodic and periodic acid can alternatively be expressed as a weight or molar ratio. In different exemplary embodiments, iodic acid and periodic acid can be present in the formulation in an iodic acid to periodic acid ratio of, for example, about 200:1, 100:1, 90:1, 80:1, 70:1, 60:1, 50:1, 40:1, 30:1, 20:1, 15:1, 10:1, 9:1, 8:1, 7:1, 6:1, 5:1, 4:1, 3:1, 2:1, 1:1, 1:2, 1:3, 1:4, 1:5, 1:6, 1:7, 1:8, 1:9, 1:10, 1:15, 1:20, 1:30, 1:40, 1:50, 1:60, 1:70, 1:80, 1:90, 1:100, 1:200, or within a particular range bounded by any two of the foregoing weight or molar ratios.

The pH of the formulation is preferably less than 7. In different embodiments, the pH is about or no more than 6, 5.5, 5, 4.5, 4, 3.5, 3, 2.5, 2, 1.5, or 1, or within a range bounded by any two of the foregoing values (e.g., 1-6, 1-5, 1-4, 1-3, 2-6, 2-5, 2-4, or 2-3).

The CMP formulation of the invention can also be in the form of a concentrate, which, when appropriately diluted, results in a CMP formulation to be used directly in a CMP process. The CMP concentrate can contain iodic acid, and optionally, periodic acid, in any of the concentrations described above, except for the minimum exemplary concentrations provided, such that upon dilution the final formulation for use in a CMP process contains iodic acid, and optionally, periodic acid, in one of the exemplary concentrations described above. Alternatively, the CMP concentrate contains iodic acid, and optionally, periodic acid, in a concentration exceeding the maximum exemplary concentrations for these components as specified above (i.e., in a concentration exceeding 20 g/L). The maximum feasible concentration of iodic and periodic acids is typically governed by the individual or combined solubility saturation points of these compounds in water, or the stability of the formulation during storage. In different embodiments, the concentration of iodic acid, and optionally, periodic acid, in a concentrate can be, independently, for example, about or at least 25 g/L, 30 g/L, 35 g/L, 40 g/L, 45 g/L, 50 g/L, 60 g/L, 70 g/L, 80 g/L, 90 g/L, 100 g/L, 110 g/L, 120 g/L, 130 g/L, 140 g/L, 150 g/L, 160 g/L, 170 g/L, 180 g/L, 190 g/L, 200 g/L, 210 g/L, 220 g/L, 230 g/L, 240 g/L, 250 g/L, 300 g/L, 350 g/L, 400 g/L, 450 g/L, or 500 g/L, or within a range bounded by any two of the foregoing exemplary values.

The concentrate can be in the form of a single solution, which, when diluted, results in one of the CMP formulations described above. Alternatively, the concentrate can be in the form of a set of concentrates designed to be mixed together to achieve any of the formulations described above. For example, a first concentrate can contain iodic acid while a second concentrate to be mixed with the first concentrate contains periodic acid; or, for example, a first concentrate can contain iodic acid, and optionally, periodic acid, while a second concentrate to be mixed with the first concentrate contains one or more additional or auxiliary ingredients (e.g., a surfactant, and/or an oxidizer other than iodic or periodic acid, and/or a corrosion inhibitor, and/or a stabilizer, and/or an etchant).

Any of the formulations described above can optionally include one or more oxidizers other than iodic acid or periodic acid (i.e., one or more additional oxidizers). Some examples of additional oxidizers include the nitrates (e.g., ammonium nitrate), chlorates, perchlorates, bromates, perbromates, permanganates (e.g., potassium permanganate), chromates, and dichromates. The concentration of the additional oxidizer in the formulation can be any of the exemplary concentrations given above for iodic and periodic acid, or an amount significantly less than the exemplary minimum of 0.1 g/L (e.g., at or less than 0.05 g/L or 0.01 g/L). However, in some embodiments, it may be desirable to exclude additional oxidizers, or to exclude only one or more of the exemplary additional oxidizers given above from the formulation.

Any of the formulations described above can optionally include one or more amino compounds or materials. Some examples of these types of compounds or materials include ammonia, monoalkylamines, dialkylamines, trialkylamines, alkylenediamines, and dialkylenetriamines. However, in some embodiments, it may be desirable to exclude amino and/or amido and/or ureido compounds or materials, or to exclude only one or more of these types of compounds (e.g., ammonia) from the formulation.

Any of the formulations described above can optionally include one or more surfactants. The surfactants can function, for example, as wetting agents, stabilizing agents, solubilizing agents, or viscosifying agents. However, in some embodiments, it may be desirable to exclude surfactants, or to exclude only one or more types of surfactants from the formulation.

In one embodiment, the one or more surfactants include an ionic surfactant, which can be either an anionic, cationic, or zwitterionic surfactant. Some examples of anionic surfactants include the fluorinated and non-fluorinated carboxylates (e.g., perfluorooctanoates, perfluorodecanoates, perfluorotetradecanoates, octanoates, decanoates, tetradecanoates, fatty acid salts), the fluorinated and non-fluorinated sulfonates (e.g., perfluorooctanesulfonates, perfluorodecanesulfonates, octanesulfonates, decanesulfonates, alkyl benzene sulfonate), the fluorinated and non-fluorinated sulfate salts (e.g., dodecyl sulfates, lauryl sulfates, sodium lauryl ether sulfate, perfluorododecyl sulfate, and other alkyl and perfluoroalkyl sulfate salts). The majority of cationic surfactants contain a positively charged nitrogen atom, such as found in the quaternary ammonium surfactants, e.g., the alkyltrimethylammonium salts wherein the alkyl group typically possesses at least four carbon atoms and up to 14, 16, 18, 20, 22, 24, or 26 carbon atoms. Some examples of cationic surfactants include the quaternary ammonium surfactants (e.g., cetyl trimethylammonium bromide, benzalkonium chloride, and benzethonium chloride), the pyridinium surfactants (e.g., cetylpyridinium chloride), and the polyethoxylated amine surfactants (e.g., polyethoxylated tallow amine). Some examples of zwitterionic surfactants include the betaines (e.g., dodecyl betaine, cocamidopropyl betaine) and the glycinates. Some examples of non-ionic surfactants include the alkyl polyethyleneoxides, alkylphenol polyethyleneoxides, copolymers of polyethyleneoxide and polypropyleneoxide (e.g., poloxamers and poloxamines), alkyl polyglucosides (e.g., octyl glucoside, decyl maltoside), fatty alcohols, (e.g., cetyl alcohol, oleyl alcohol), fatty amides (e.g., cocamide MEA, cocamide DEA), and polysorbates (e.g., polysorbate 20, polysorbate 40, polysorbate 60, polysorbate 80).

The CMP formulations described herein can be prepared by any of the suitable methods known in the art. For example, the formulation can be prepared by combining a suitable amount of iodic acid, abrasive particulate, water, and optionally, periodic acid, under mixing conditions suitable for achieving dissolution of all components. In a preferred embodiment, an appropriate amount of a solution of a dispersed particulate (e.g., colloidal silica) is combined with an appropriate amount of one or more solutions containing iodic acid, and optionally, periodic acid, and then a suitable amount of water is added to bring the formulation to a desired final volume. The water is preferably purified water, such as deionized (DI) or distilled water.

In another aspect, the invention is directed to a method for chemical-mechanical polishing a metal-containing substrate (i.e., "substrate") by use of any of the formulations described above. In one embodiment, the metal-containing substrate has a surface composed solely of metal (e.g., a single metal, or a heterogeneous combination or homogeneous mixture of metals). In another embodiment, the metal-containing substrate has a surface composed of one or more metals in combination with a non-metal, such as a metal oxide, ceramic, or polymeric material. The metal to be polished can be any one or a combination of transition and/or main group metals. Some metals particularly considered herein include copper, aluminum, and tungsten.

The method described herein is particularly suited for chemical-mechanical polishing of a semiconductor substrate. The semiconductor substrate typically includes a metal (particularly tungsten, copper, and/or aluminum) on its surface to be polished. The semiconductor also typically includes non-metal components, such as an insulator or dielectric component.

In the polishing method, the substrate is polished typically by the rubbing action of a polishing pad on the substrate while the substrate is in contact with the CMP formulation. The polishing pad can have any of the polishing pad constructions and designs known in the art (e.g., polyurethane laminate). Typically, the polishing pad is attached to a polishing machine that spins the polishing pad on the substrate at a desired rotational speed (i.e., revolution) and polishing pressure. The rotational speed of the pad is typically 40, 50, 60, 70, or 80 revolutions per minute (rpm). The polishing pressure is generally at least 20 kPa, and in different embodiments, at least, about, or no more than 22, 24, 26, 28, 30, 32, 34, or 36 kPa, or within a range therein. Typically, the substrate is contacted with the formulation by flowing the formulation over the substrate while the substrate is either submerged or not submerged in the formulation. The flow rate is typically at least 50 mL/min, and in different embodiments, at least, about, or no more than 60, 70, 80, 90, 100, 125, 150, 200, 225, 250, 275, 300, 325, 350, 375, 400, 425, 450, 475, or 500 mL/min, or within a range therein. Other factors, such as polishing time and temperature can be suitably adjusted in order to achieve the desired metal removal rate and polishing end result.

The above-described method can achieve a uniformly planarized substrate surface. In particular, the substrate surface, after being treated by the above method, preferably possesses a thickness variation (preferably, a standard deviation) of no more than 10%, and more preferably, no more than 5%, 2%, 1%, 0.5%, or 0.1%.

Examples have been set forth below for the purpose of illustration and to describe certain specific embodiments of the invention. However, the scope of this invention is not to be in any way limited by the examples set forth herein.

EXAMPLE 1

Preparation of CMP Formulations

Formulation 1 (2.17 g/L of Iodic Acid, 14.4 g/L Periodic Acid)

2.2 liters of a commercially available solution of periodic acid (i.e., DA Nano MicroPlanar® 3510*) was combined with 38 grams of iodic acid and 5.3 liters of a commercially available colloidal silica (i.e., MicroPlanar® 3850**), and this followed by a final dilution with 10 liters of DI water under appropriate mixing conditions to provide the formulation to be used in a CMP process. For the purpose of simplicity, the foregoing formulation can also be denoted as a 1.5 wt % iodic acid solution, wherein 1.5 wt % is relative to the weight of the commercial periodic acid solution (2530 grams), i.e., 38 grams of iodic acid per 2530 grams weight of the 2.2 L of the periodic acid commercial solution amounts to 1.5 wt %.

* DA Nano MicroPlanar® 3510 (i.e., "3510") is a 10% by weight solution of periodic acid in water with a density of 1.15 g/mL. Accordingly, 2.2 L of 3510 has a total weight of 2530 grams, of which 253 grams is due to periodic acid. The total end volume of each exemplary formulation above is 17.5 liters. Therefore, 253 g of periodic acid per the 17.5 L total volume corresponds to 14.4 g/L of periodic acid in each of the two exemplary formulations.
** MicroPlanar® 3850 is an aqueous, acidic, colloidal suspension of silica particles (30% solids nominal). The density at 25° C. is within the range of 1.180-1.295 g/mL. The pH at 25° C. is within the range of 2.2-3.0. The solids content is within the range of 29.5-30.5%. The mean particle size is within the range of 30-85 nm.

Formulation 2 (4.34 g/L of Iodic Acid, 14.4 g/L Periodic Acid)

2.2 liters of a commercially available solution of periodic acid (i.e., DA Nano MicroPlanar® 3510*) was combined with 76 grams of iodic acid and 5.3 liters of a commercially available colloidal silica (i.e., MicroPlanar® 3850**), and this followed by a final dilution with 10 liters of DI water under appropriate mixing conditions to provide the formulation to be used in a CMP process. For the purpose of simplicity, the foregoing formulation can also be denoted as a 3.0 wt % iodic acid solution, wherein 3.0 wt % is relative to the weight of the commercial periodic acid solution (2530 grams), i.e., 76 grams of iodic acid per 2530 grams weight of the 2.2 L of the periodic acid commercial solution amounts to 3.0 wt %.

* DA Nano MicroPlanar® 3510 (i.e., "3510") is a 10% by weight solution of periodic acid in water with a density of 1.15 g/mL. Accordingly, 2.2 L of 3510 has a total weight of 2530 grams, of which 253 grams is due to periodic acid. The total end volume of each exemplary formulation above is 17.5 liters. Therefore, 253 g of periodic acid per the 17.5 L total volume corresponds to 14.4 g/L of periodic acid in each of the two exemplary formulations.
** MicroPlanar® 3850 is an aqueous, acidic, colloidal suspension of silica particles (30% solids nominal). The density at 25° C. is within the range of 1.180-1.295 g/mL. The pH at 25° C. is within the range of 2.2-3.0. The solids content is within the range of 29.5-30.5%. The mean particle size is within the range of 30-85 nm.

EXAMPLE 2

CMP Processing of a Tungsten Wafer

The wafers used to obtain the removal data were pre-measured Blanket W wafers with about 3000 Å of tungsten. The wafers were then polished on an EBARA F REX400 chemical-mechanical polishing machine using a standard tool monitor recipe for obtaining the tungsten removal amount and removal profile across a 300 mm wafer.

Table of Process Conditions

| Paramater | Process Conditions |
| --- | --- |
| CMP Tool | EBARA F REX300 |
| Polishing Pad | R&H VISION Pad ™ 3500 |
| POU Slurry Filter | Pall Profile II 0.5 um |
| Dresser Type | 3M E187 |
| Polish Time (sec.) | 60 |
| Pressures (Fours Zones) | |
| Backside (hPa) | 280 |
| Sub-Carrier (hPa) | 250 |

-continued

Table of Process Conditions

| Paramater | Process Conditions |
| --- | --- |
| Center Zone (hPa) | 280 |
| Retainer Ring (hPa) | 300 |
| Platen Rotation (RPM) | 61 |
| Top Ring Rotation (RPM) | 62 |
| Slurry Flow Rate (ml/min) | 400 |

FIG. 1 is a graph showing tungsten removal vs. position across the 300 mm tungsten wafer, wherein a position of 0 mm corresponds to the center of the wafer. Samples 1, 2, 3, and 4 are Blanket W monitor wafers used to characterize the removal rate and removal profile of 4 different slurry production slurry batches (i.e., different lots containing MicroPlanar® 3850 colloidal silica, periodic acid, and no iodic acid). The four samples show that both the tool and slurry repeat very well for all four trials even with different lost of materials for the mixtures, and thus, form a baseline for the rate experiment. The benchmark data for 0% iodic acid showed a range of W removal from 1000 to 1200 Å/min. However, the W removal rate markedly increases with the addition of iodic acid. An addition of 1.5% increases the rate to nearly 1600 Å/min. An addition of 3% nearly doubles the W removal rate to over 2000 Å/min.

The benefits of a higher W removal rate are many. First, the addition of iodic acid can be used to match the W and the oxide (insulator) removal rate. If the W removal rate is less than the oxide rate, the wafer uniformity will likely be poor. This non-uniformity issue occurs because, once the W is removed, oxide removal begins. Areas of the wafer where the W clears the wafer first can have markedly more oxide removed compared to the areas of the wafer that clear last. Another benefit of higher W rates it that the rate can be traded off by lowering the down force to obtain improved defectivity (reduced polish scratches). Lastly, a higher W rate results in shorter polish times, which, in itself, provides many benefits, such as less use of the slurry (i.e., reduced materials cost), higher tool throughput, and increased economy of space.

Figure 2:
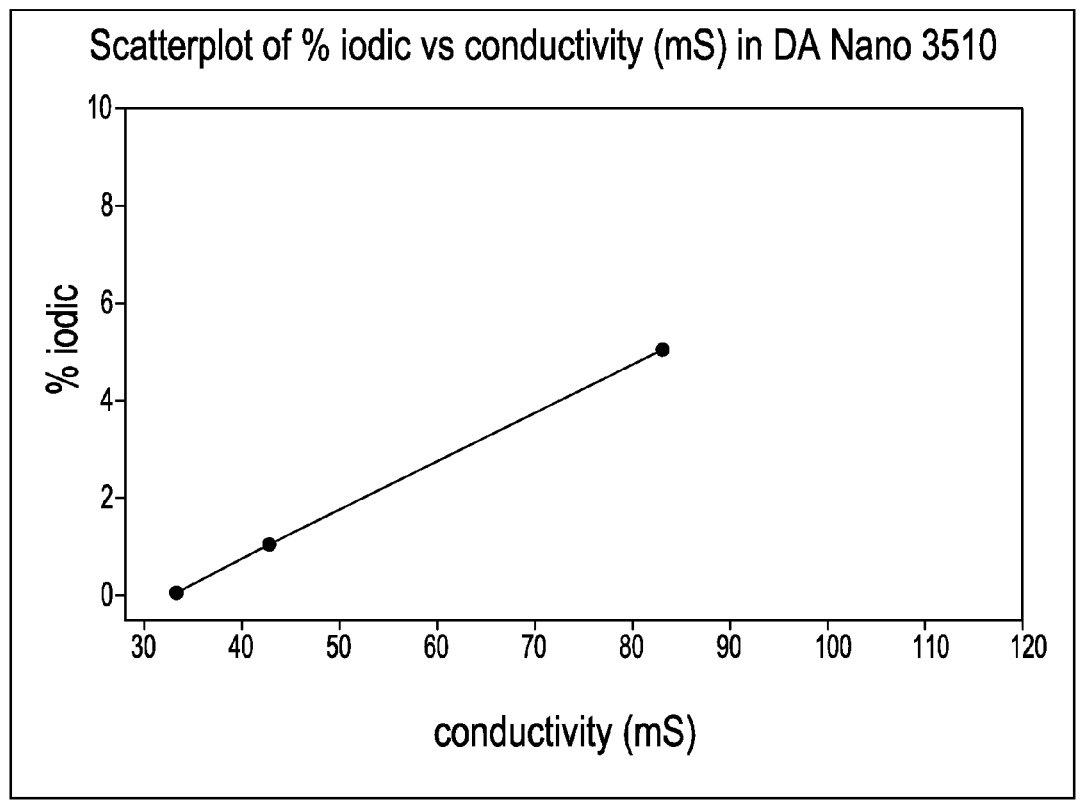
FIG. 2 is a graph showing a correspondence between wt % of iodic acid and the conductivity of the CMP formulation.

FIG. 2 is a graph showing concentration of iodic acid in DA Nano 3510 vs. the conductivity (mS). The correspondence between concentration of iodic acid and conductivity of the CMP formulation allows for a more automated system in the preparation of a CMP formulation of the invention of a particular concentration. In particular, a CMP formulation having a desired concentration of iodic acid can be found by reaching a certain conductivity known to correspond to the desired concentration. As shown by FIG. 2, each 1 wt % increase of iodic acid corresponds to about a 10 mS increase in conductivity. Note that the weight percentages given in FIG. 2 are defined according the alternative definition described in Example 1, i.e., in terms of grams of iodic acid relative to grams of commercial periodic acid solution.

While there have been shown and described what are presently believed to be the preferred embodiments of the present invention, those skilled in the art will realize that other and further embodiments can be made without departing from the spirit and scope of the invention described in this application, and this application includes all such modifications that are within the intended scope of the claims set forth herein.

What is claimed is:

1. A method for polishing a tungsten-containing substrate, the method comprising polishing the tungsten-containing substrate with a polishing pad at a suitable polishing pressure while the tungsten-containing substrate is in contact with a chemical-mechanical polishing formulation comprising: an abrasive particulate component, iodic acid, periodic acid, and water, wherein said iodic acid is in a concentration of at least 1 gram and up to about 5 grams of iodic acid per liter of the formulation, and said periodic acid is in a concentration of at least 10 grams and up to about 20 grams of periodic acid per liter of the formulation, wherein a tungsten removal rate of at least 1600 Å/min is achieved.

2. The method of claim 1, wherein the iodic acid is in a concentration of at least 2 grams of iodic acid per liter of the formulation.

3. The method of claim 1, wherein a tungsten removal rate of at least 2000 Å/min is achieved.

4. The method of claim 1, wherein the abrasive particle component is selected from silica, alumina, diamond, ceria, yttria, zirconia, titania, and combinations thereof.

5. The method of claim 1, wherein the abrasive particle component is silica.

6. The method of claim 1, wherein the abrasive particle component has a particle size in the range of 30-300 nm.

7. The method of claim 1, wherein the abrasive particle component has a particle size in the range of 30-100 nm.

8. The method of claim 1, wherein the iodic acid is in acid or salt form.

9. The method of claim 1, wherein the periodic acid is in acid or salt form.

10. The method of claim 1, wherein the tungsten-containing substrate is present on a semiconductor substrate.

11. The method of claim 10, wherein the semiconductor substrate includes an insulator component.

\* \* \* \* \*